US008338932B2

(12) United States Patent  
Borghoff et al.

(10) Patent No.: US 8,338,932 B2
(45) Date of Patent: Dec. 25, 2012

(54) POWER SEMICONDUCTOR MODULE WITH INTERCONNECTED PACKAGE PORTIONS

(75) Inventors: Georg Borghoff, Warstein (DE); Thilo Stolze, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 29 days.

(21) Appl. No.: 12/970,342

(22) Filed: Dec. 16, 2010

(65) Prior Publication Data

US 2011/0175214 A1    Jul. 21, 2011

(51) Int. Cl.
*H01L 23/24* (2006.01)
(52) U.S. Cl. .......... 257/686; 257/E27.144; 257/E27.161
(58) Field of Classification Search .......... 257/678, 257/686, 718, 777, 778, E27.144, E27.161
See application file for complete search history.

(56) References Cited

U.S. PATENT DOCUMENTS

| 2006/0151872 A1* | 7/2006 | Lenniger | 257/706 |
| 2009/0298228 A1* | 12/2009 | Sato et al. | 438/108 |
| 2010/0105169 A1* | 4/2010 | Lee et al. | 438/107 |

FOREIGN PATENT DOCUMENTS

DE    10329102 A1    1/2005

OTHER PUBLICATIONS

Office Action issued Aug. 2, 2010 in re: Application No. DE 10 2010 000 943.1-33.

* cited by examiner

*Primary Examiner* — Brook Kebede
(74) *Attorney, Agent, or Firm* — Murphy, Bilak & Homiller, PLLC

(57) ABSTRACT

A power semiconductor module includes a package having a first package portion and a second package portion. The side of the first package portion facing the second package portion has an anchoring element with a first recess. The second package portion includes a second recess with an indentation which receives the anchoring element. To produce a mechanically firm connection between the first package portion and the second package portion, a plug-in element is inserted in the first recess and the second recess. The plug-in element displaces the anchoring element transversely with respect to the plug-in direction, causing the anchoring element to engage the indentation so that a form-fit connection is produced between the first package portion and the second package portion. The plug-in element prevents the anchoring element from disengaging the indentation.

13 Claims, 8 Drawing Sheets

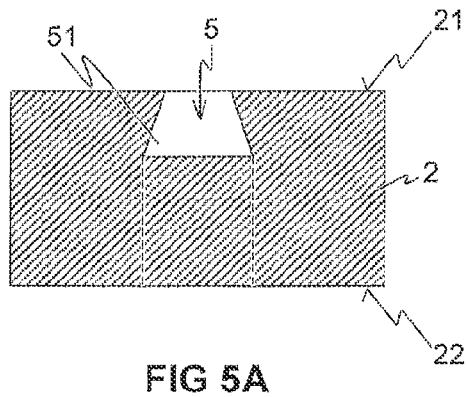
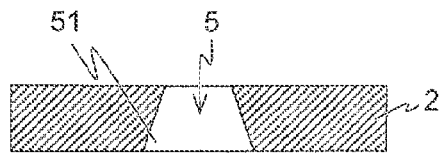
FIG 5A
FIG 5B
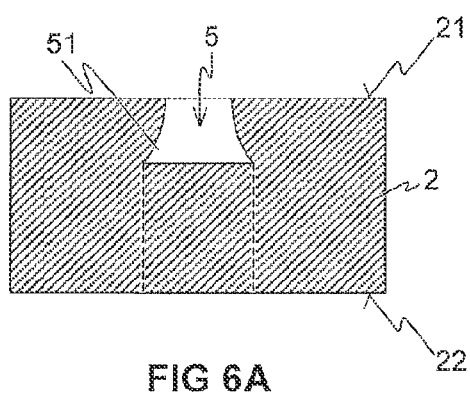
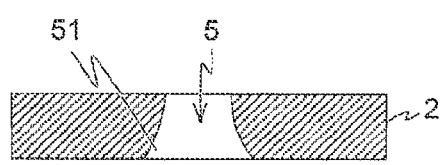
FIG 6A
FIG 6B
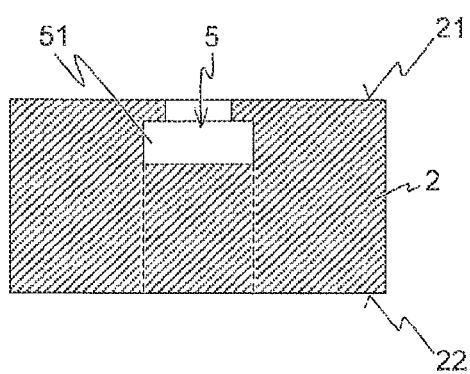
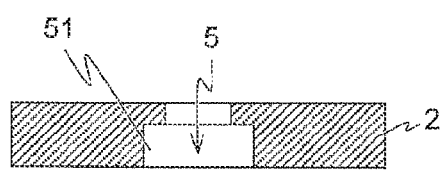
FIG 7A
FIG 7B

POWER SEMICONDUCTOR MODULE WITH INTERCONNECTED PACKAGE PORTIONS

PRIORITY CLAIM

This application claims priority from German patent application 10 2010 000 943.1 filed on 15 Jan. 2010, the content of said German application incorporated herein by reference in its entirety.

FIELD OF THE INVENTION

The present invention generally relates to a power semiconductor module, and particularly to a power semiconductor module having interconnected package portions and a method for fabricating such a power semiconductor module.

BACKGROUND

Power semiconductor modules have one or more power semiconductor chips which are arranged in a package. The package serves to protect the power semiconductor chips from environmental influences, and for electrically insulating the circuit produced by the power semiconductor chips.

By way of example, such a package may have individual side walls, or a package frame which forms the side walls of the module, and also a package cover and/or a baseplate. In order to fabricate the package, the side walls or the package frame must be connected to the package cover and/or to the baseplate with a precise fit and in mechanically robust form.

However, screw connections require screw elements and hence a correspondingly complex assembly process. In order to produce adhesive bonds, the adhesive needs to be distributed, the package portions to be connected need to be mated and the adhesive needs to be cured, which is complex and time-consuming. For ultrasonic welding and locking, it is necessary to observe low process tolerances. In addition, locking allows only low load-bearing capacity to be achieved for the connection. Caulking likewise requires low process tolerances to be observed.

SUMMARY

A power semiconductor module is provided in which individual package elements are connected using a connection technique which is feasible for mass production, and in which it is possible to dispense with the cited connection techniques (e.g. screwing, adhesive bonding, ultrasonic welding, locking, caulking). A corresponding method is described for fabricating such a power semiconductor module.

According to one embodiment of a power semiconductor module, the module includes a package having a first package portion and a second package portion. The side of the first package portion facing the second package portion has an anchoring element with a first recess. The second package portion has a second recess with an indentation which receives the anchoring element. The anchoring element engages the indentation, so that there is a form-fit connection between the first package portion and the second package portion. In order to prevent the anchoring element from disengaging from the indentation, a plug-in element is provided which is inserted in the first recess and the second recess and which prevents the anchoring element from disengaging from the indentation and thus protects the form-fit connection between the first package portion and the second package portion.

According to an embodiment of a method for fabricating a power semiconductor module, the method involves the provision of a first package portion, which has an anchoring element with a first recess, and the provision of a second package portion, which has a second recess with an indentation. In addition, a plug-in element is provided. When the anchoring element has been positioned in the second recess, the plug-in element is inserted in the first recess and the second recess. This prompts the anchoring element to be displaced laterally, in relation to the plug-in direction, so that a displaced section of the anchoring element engages the indentation, with a form-fit connection being produced between the first package portion and the second package portion.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 5A shows a vertical section through a package portion which is in the form of a side wall element and has a recess which has an indentation which is formed by an oblique, straight side wall of the recess.

FIG. 5B shows a vertical section through a package portion which is in the form of a package cover or package base and has a recess which has an indentation which is formed by an oblique, straight side wall of the recess.

FIG. 6A shows a vertical section through a package portion which is in the form of a side wall element and has a recess which has an indentation which is formed by a continually curved side wall of the recess.

FIG. 6B shows a vertical section through a package portion which is in the form of a package cover or package base and has a recess which has an indentation which is formed by a continually curved side wall of the recess.

FIG. 7A shows a vertical section through a package portion which is in the form of a side wall element and has a recess which has an indentation which is formed by a step in the side wall of the recess.

FIG. 7B shows a vertical section through a package portion which is in the form of a package cover or package base and has a recess which has an indentation which is formed by a step in the side wall of the recess.

DETAILED DESCRIPTION

The detailed description which follows relates to the accompanying drawings, which form part of the description and in which specific refinements are used to explain the way in which the invention can be implemented. Directional statements in this regard, such as "top", "bottom", "front", "back", "anterior", "posterior" etc., are used in relation to the orientation of the figures explained. Since the elements in the refinements can be arranged in a multiplicity of different orientations, the directional terminology serves merely to clearly explain the figures and should in no way be understood to be limiting. It is pointed out that the present invention may also comprise other refinements. In addition, it is pointed out that any features of the various exemplary refinements described below can be combined with one another unless anything to the contrary is expressly mentioned, or provided that a combination of particular features is not precluded for technical reasons.

Figure 1A:
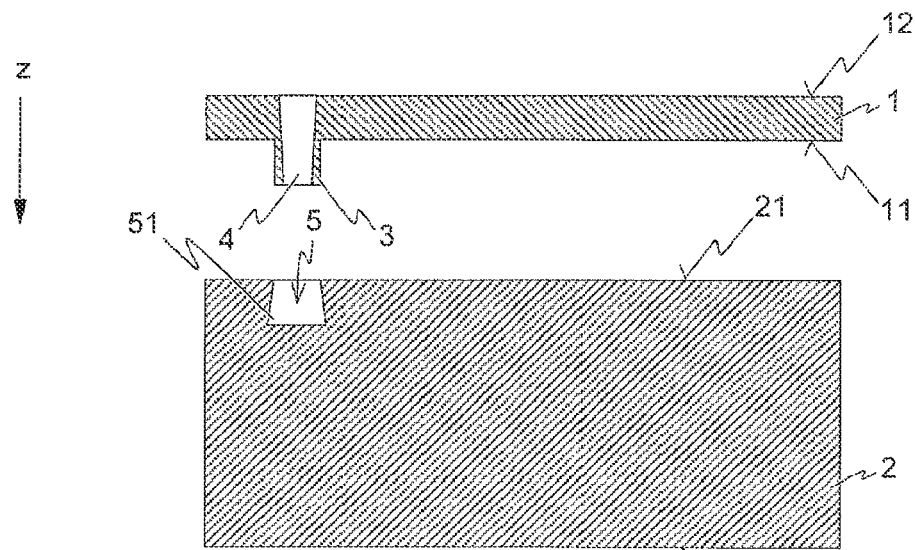
FIG. 1A shows a vertical section through two package portions for a power semiconductor module which are to be connected to one another, one of which is in the form of a cover or in the form of a baseplate and has an anchoring element, and the other of which is in the form of a package side wall element which is provided with a recess.

FIG. 1A shows a vertical section through two package portions of a package for a power semiconductor module which are intended to be connected to one another. The module comprises a package having a first package portion 1 and a second package portion 2. By way of example, the second package portion 2 may be a side wall of an individual side, an annularly closed package frame, or may be an arbitrary section of a package side wall of the power semiconductor module package. By way of example, the first package portion 1 may be in the form of a flat package cover or in the form of a baseplate of the module package.

In order to mechanically connect the first package portion 1 to the second package portion 2, the first package portion 1 has an anchoring element 3 which is provided with a first recess 4. In the present example, the anchoring element is in the form of a tubular extension on the first package portion 1. In this case, recesses within the context of the present application are regarded as depressions which are partially or totally sealed at their end, as is the case with blind holes, for example, or else passage openings, as shown by way of example in FIG. 1A.

The second package portion 2 has a second recess 5 which extends from a first side 21 of the second package portion 2 into the second package portion 2 and which is in a form such that it can completely or at least partially accept the anchoring element 3 when the first package portion 1 has a first side 11 placed onto the first side 21 of the second package portion 2. The second recess 5 comprises an indentation 51 which is formed by virtue of the width of the second recess 5 being increased—in at least one sectional plane through the second package portion 2—in a subregion of the second recess 5 as depth increases. In this case, the depth is ascertained in relation to the level of the entrance opening of the second recess 5. In the case of the arrangement shown in FIG. 1A, this level is situated on the first side 21 of the second package portion 2. In the present example, the indentation 51 is formed by virtue of the second recess 5 having an inclined side wall.

Figure 1B:
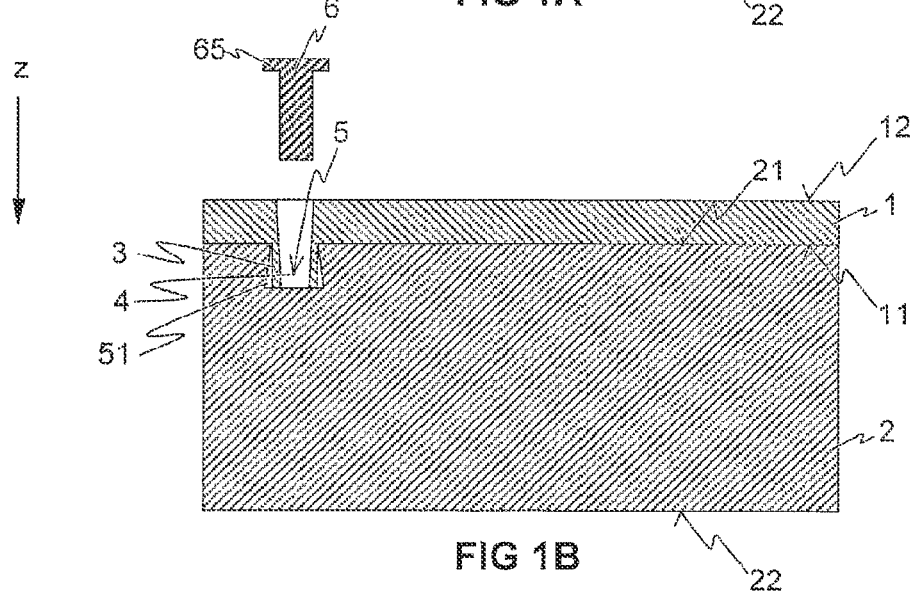
FIG. 1B shows a vertical section through the package portions shown in FIG. 1A, where the anchoring element has been introduced into the recess.

FIG. 1B shows the arrangement after the first package portion 1 has been placed on the second package portion 2 with a precise fit such that the anchoring element 3 is arranged in the second recess 5. If the first package portion 1 is a package cover or a baseplate of the module package, for example, and the second package portion 2 is a package frame of the module package, then the first package portion 1 may be in a form such that it covers an opening formed by the second package portion 2 completely. As can also be seen from FIG. 1B, a subregion of the second recess 5 between the anchoring element 3 and the second package portion 2, which subregion is formed on the basis of the indentation 51, remains at least temporarily free.

Figure 1C:
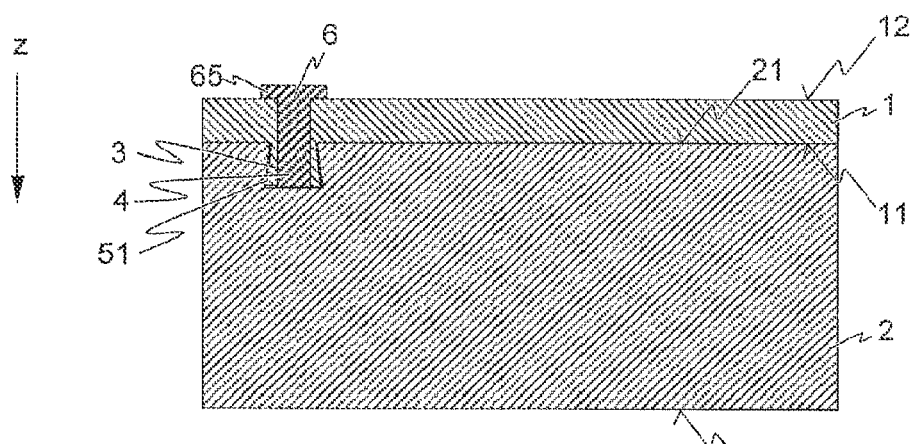
FIG. 1C shows a vertical section through the arrangement shown in FIG. 1B after a plug-in element has been introduced into the recess.

In addition, a plug-in element 6 is provided which can be introduced from a second side 12 of the first package portion 1, which is remote from the second package portion 2, both into the first recess 4 and into the second recess 5, so that the arrangement in FIG. 1C is produced.

To this end, the first recess 4 is in a form such that, when the plug-in element 6 is slid into the first recess 4, it has a lack of length in comparison with the plug-in element 6 at least at a slide-in position, so that the anchoring element 3 is displaced at least to some extent laterally, i.e. at right angles to the slide-in direction z, to the extent that the anchoring element 3 engages in the indentation 51, which produces a form-fit connection between the first package portion 1 and the second package portion 2. In addition, the plug-in element 6 prevents the anchoring element 3 from disengaging from the indentation 51. In order to allow lateral displacement of the anchoring element 3, the first recess tapers at least in a particular section as the distance from the first package portion 1 increases. Such tapering can be effected conically or in steps, for example. Any other tapers are likewise possible, however.

Figure 2A:
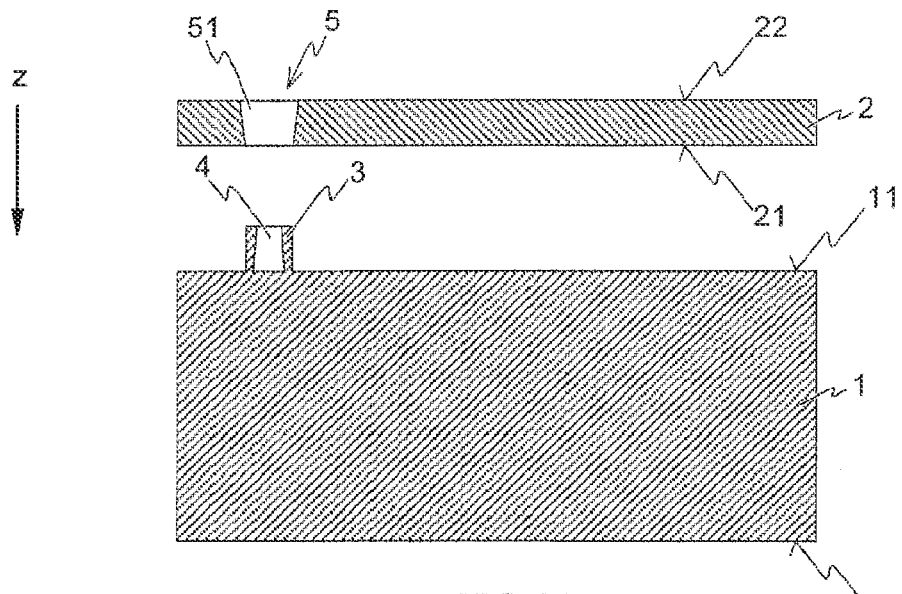
FIG. 2A shows a vertical section through two package portions for a power semiconductor module which are to be connected to one another, one of which is in the form of a cover or in the form of a baseplate and has a recess, and the other of which is in the form of a package side wall element which is provided with an anchoring element.

Another embodiment is shown in FIG. 2A. In this arrangement, the first package portion 1 is in the form of a package side wall, in the form of an annularly closed package frame, or in the form of part of a package side wall or of an annularly closed package frame, while the second package portion 2 is a package cover or a baseplate of the module package.

As in the case of the arrangement shown in FIG. 1A, the anchoring element 3 is arranged as an extension on the first package portion 1 and is of integral design with the latter. In addition, the anchoring element 3 also has a first recess 4 which is sealed at the lower end thereof but which can optionally also extend continuously as far as the second side 12 of the first package portion 1, which forms the side of the first package portion 1 remote from the first side 11.

Figure 2B:
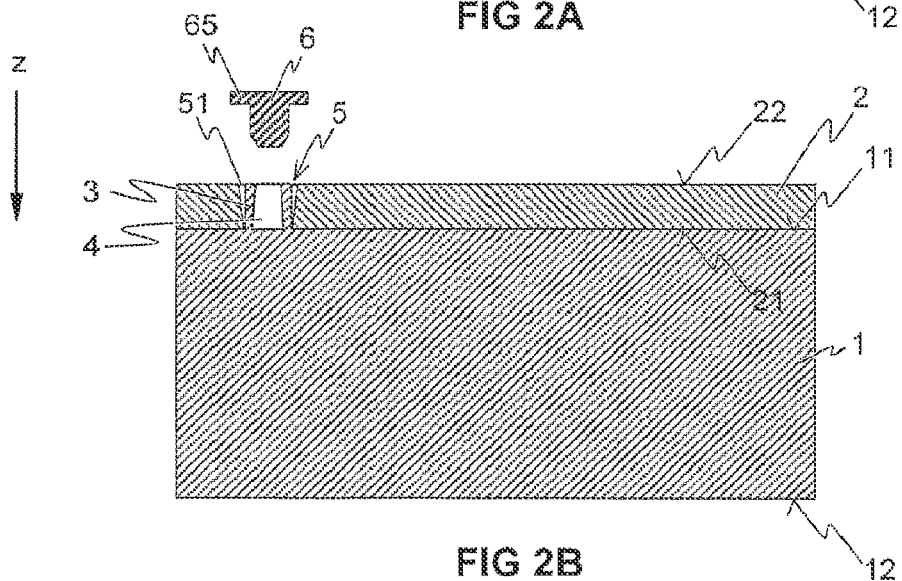
FIG. 2B shows a vertical section through the package portions shown in FIG. 2A, where the anchoring element has been introduced into the recess.

The second package portion 2 has a second recess 5 which is in the form of a passage opening. The anchoring element 3 and the second recess 5 are in tune with one another such that the anchoring element 3 can be inserted into the second recess 5 without force or only with little force, so that the arrangement shown in FIG. 2B is produced. The insertion can be effected such that the anchoring element 3 is not deformed in the process. Alternatively, it is possible for the anchoring element 3 and/or the first package portion 1 to be deformed elastically or plastically when the anchoring element 3 is inserted into the second recess 5, for example by virtue of the anchoring element 3 having an excess length in comparison with the second recess 5.

Since, in this embodiment too, the second recess 5 is provided with an indentation 51, a free region remains at least temporarily between the anchoring element 3 and the second package portion 2 after the anchoring element 3 has been positioned in the second recess 5.

Figure 2C:
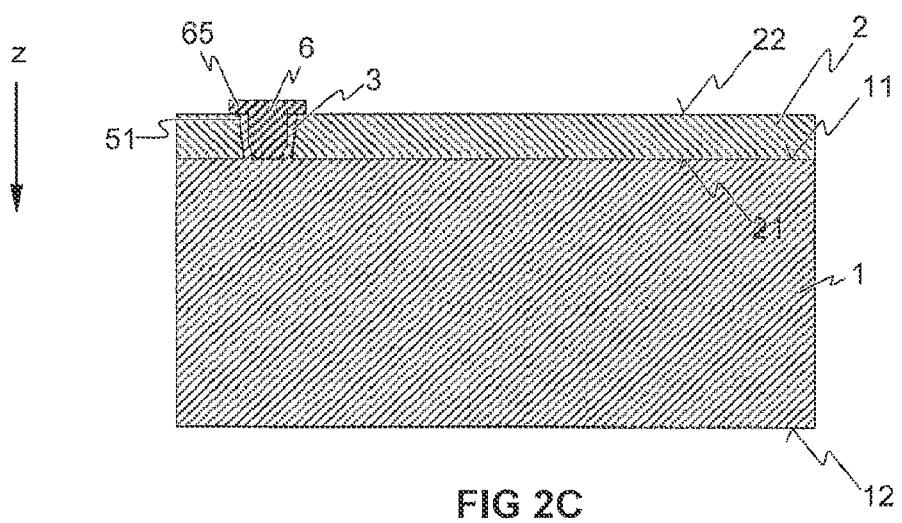
FIG. 2C shows a vertical section through the arrangement shown in FIG. 2B after a plug-in element has been introduced into the recess.

As FIG. 2C shows, the anchoring element 3 can be displaced laterally, i.e. at generally right angles to the plug-in direction z, to a certain degree by introducing a suitably dimensioned plug-in element 6 into the first recess 4 and into the second recess 5, so that the anchoring element 3 engages in the indentation 51, so that a form-fit connection is produced between the first package portion 1 and the second package portion 2. The plug-in element 6 introduced into the first recess 4 and into the second recess 5 prevents the anchoring element 3 from disengaging from the indentation 51 and hence reliably protects the mechanical connection between the first package portion 1 and the second package portion 2.

In this embodiment too, the plug-in element 6 is in a form such that it has an excess length in comparison with the first recess 4 when slid into the first recess 4 at least one slide-in position laterally with respect to the slide-in direction z, the excess length prompting the anchoring element 3 to be expanded laterally with respect to the slide-in direction z and thereby to engage in the indentation 51.

Figure 3A:
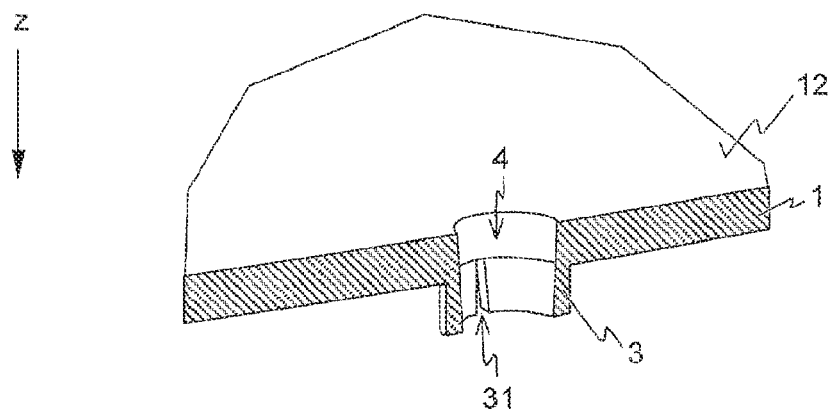
FIG. 3A shows a vertical section through a package portion for a power semiconductor module, which package portion is in the form of a cover or in the form of a baseplate and is provided with a slit anchoring element.

FIG. 3A shows a perspective sectional view through a first package portion 1, which may be of the same design as the first package portion 1 shown in FIGS. 1A to 1C. As can be seen from FIG. 3A, an anchoring element 3 may have one or more slits 31 which facilitate lateral, elastic or plastic displacement of the anchoring element 3 when a plug-in element 6 is plugged into the first recess 4 as shown in FIG. 3B.

Figure 3B:
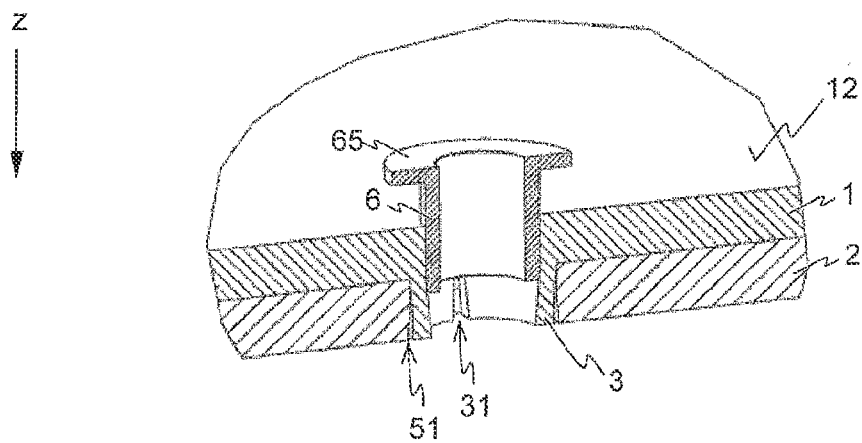
FIG. 3B shows a vertical section through the package portion shown in FIG. 3A when assembled on another package portion which is part of a side wall of the package while the plug-in element is being introduced.
Figure 3C:
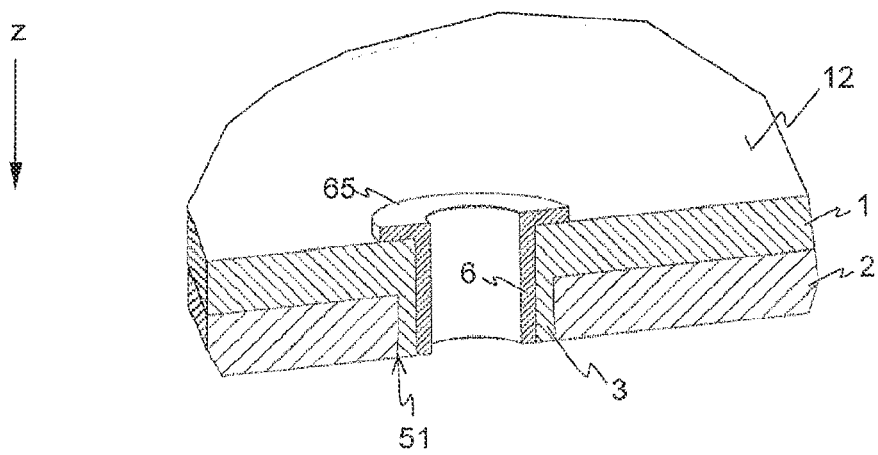
FIG. 3C shows a vertical section through the arrangement shown in FIG. 3B after the plug-in element has been introduced into the first recess completely.

Whereas the plug-in element 6 in the arrangements shown in FIGS. 1B, 1C, 2B and 2C is in the form of a solid pin by way of example, the plug-in element 6 shown in FIG. 3B is a hollow element. A hollow element of this kind may have a tubular section, for example. This section may be—as shown—a cylindrical tube, for example. Any other tube cross sections are likewise possible, however.

Figure 4A:
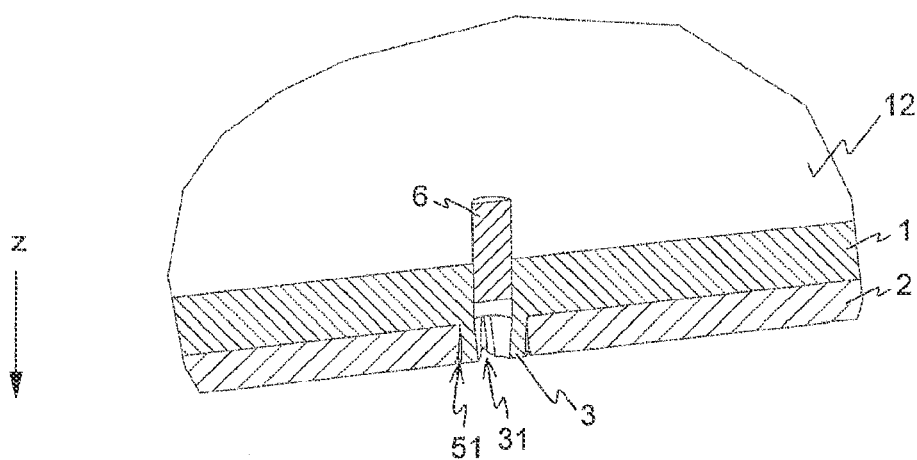
FIG. 4A shows an arrangement as shown in FIG. 3B with the differences that the plug-in element is in the form of a solid body and is produced without a stop.
Figure 4B:
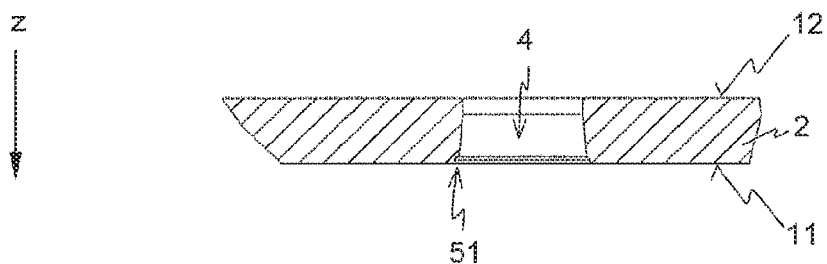
FIG. 4B shows an enlarged illustration of a vertical section through the part of a package side wall which is shown in FIG. 4A in the region of the first recess.
Figure 4C:
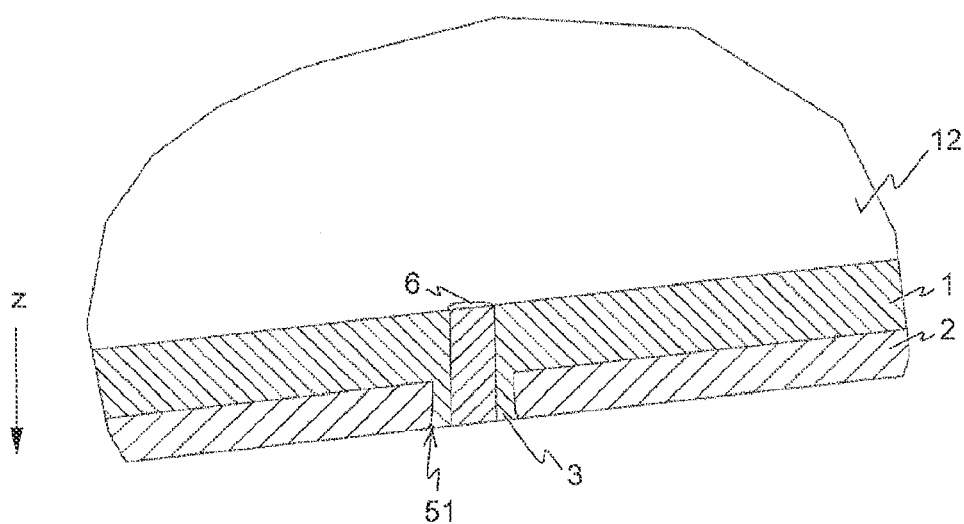
FIG. 4C shows the arrangement shown in FIG. 4A after the plug-in element has been introduced into the first recess completely.

As can also be seen from the plug-in elements 6 shown in FIGS. 1B, 1C, 2B, 2C, 3B and 3C, a plug-in element 6 may have a stop 65 which hits the first package portion 1 on the second side 12 of the first package portion 1, which is remote from the second package portion 2, when the plug-in element 6 is plugged into the first recess 4, so that the plug-in depth is limited by the stop 61. As shown in the present exemplary embodiments, a stop 65 of this kind may be in the form of a circumferential collar on the plug-in element 6, for example. In principle, it is also possible to dispense with such a stop 65, however, as shown in a further exemplary embodiment in FIGS. 4A to 4C.

In the embodiment described above, the indentation in the second recess 5 is produced by inclined, straight side walls, as shown in FIG. 5A for the second recess 5 in the second package portion 2 shown in FIGS. 1A to 1C and in FIG. 5B for the second recess 5 in the second package portion 2 shown in FIGS. 2A to 2C.

However, an indentation 51 in the second recess 5 in a second package portion 2 does not necessarily need to be produced by inclined side walls of the second recess 5. Alternatively or in addition, the side wall of the second recess 5 may be designed to be continuously curved completely or at least in sections. In this context, "continuously curved" is understood to mean a continually differentiatable—in the mathematical sense—profile of the side wall or of a section of the side wall.

FIG. 6A shows a respective second recess 5 with continuously curved side walls for a second package portion 2 as shown in FIGS. 1A to 1C, and FIG. 6B shows a respective second recess 5 with continuously curved side walls for a second package portion 2 as shown in FIGS. 2A to 2C.

Instead of or in addition to an at least sectionally inclined, straight side wall and/or an at least sectionally continuously curved side wall, a second recess 5 may also have an indentation formed by a step, as shown by way of example in FIGS. 7A and 7B. FIG. 7A shows a respective second recess 5, the side wall of which has a step, for a second package portion 2 as shown in FIGS. 1A to 1C, and FIG. 7B shows a respective second recess 5, the side wall of which has a step, for a second package portion 2 as shown in FIGS. 2A to 2C.

It is possible to use and combine fundamentally any, including different, materials for the first package portion 1 and for the second package portion 2 and also for the plug-in element 6.

Insofar as a first or second package portion 1 or 2 is in the form of a package side wall or in the form of a package cover or in the form of part of a package side wall or a package cover, it may be formed from plastic, for example. Plastic is an electrical insulator and can be made into almost any arbitrary shape, for example by injection molding. By way of example, the first package portion 1 and the anchoring element 3 may be produced in the same injection mold and in the same injection molding step and thereby be an integral design.

In the examples shown in FIGS. 1A, 1B, 1C, 5A, 5B, 5C, the second recess 5 is in the form of a blind hole. Alternatively, the recess 5 may, as indicated by dashed lines in FIG. 5A, 5B, 5C, also be in the form of a passage opening between opposite sides 21 and 22 of the second package portion 2. In such embodiments, a plug-in element 6 can also be introduced into the recess 5 from the second side 22 and extend into a recess 4 in an anchoring element 3 which, as shown in FIGS. 1A to 1C, for example, is arranged in the second recess 5 when the first package portion 1 is positioned on the side 21 of the second package portion 2.

In the exemplary embodiments described above, the plug-in element 6 is respectively provided as a separate element, i.e. an element which is independent of the first package portion 1 and of the second package portion 2. In these embodiments, the plug-in element 6 is positioned correctly before it is plugged into the first recess 4 and into the second recess 5. However, the effort associated with this step can be avoided if the plug-in element 6, prior to being slid into the first recess 4 and into the second recess 5, is firmly or moveably connected to that instance of the package portions 1, 2 which is arranged between the other package portion 2, 1 and the plug-in element 6 during assembly.

Figure 8A:
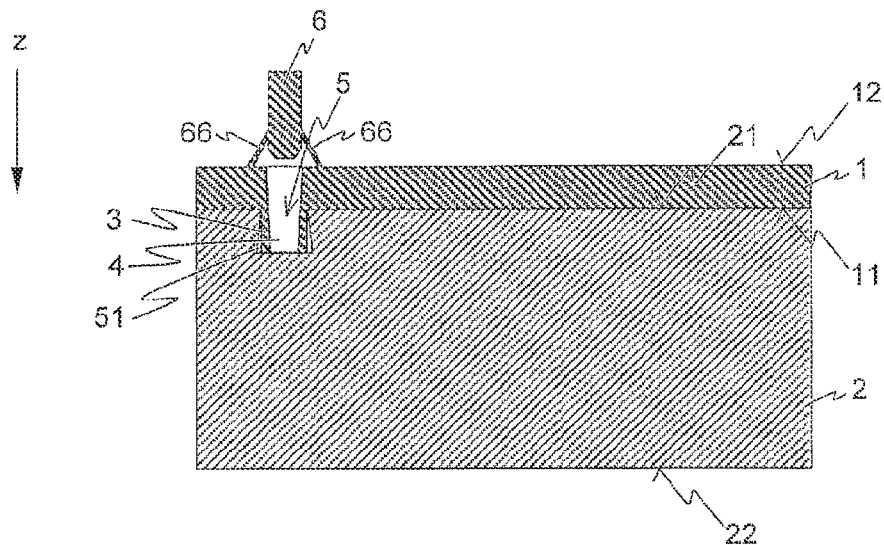
FIG. 8A shows a vertical section through an arrangement in which a plug-in element is connected to a package portion in the form of a package cover or package base by snap-off elements.

By way of example, the connection between the plug-in element 6 and the relevant package portion 1, 2 may be produced by one or more thin snap-off elements 66, e.g. in the form of a thin film or a ribbon hinge, as shown schematically in FIG. 8A. Such snap-off elements 66 can be produced together with the injection molding process, which is also used to produce the package portion 1 to which the snap-off elements 66 are connected. As a result, the snap-off elements 66 are of an integral design with the relevant package portion 1 and the plug-in element 6. Regardless of the specific refinement of the connection between the plug-in element 6 and the relevant package portion 1, such a connection allows the plug-in element 6 to adopt a prescribed, precisely defined position in relation to the first recess 4 or second recess 5 situated on the relevant package portion 1 or 2, from which position the plug-in element 6 can easily be slid into the first recess 4 and into the second recess 5 without previously aligning the plug-in element 6 laterally with respect to the slide-in direction z.

Hence, in such an embodiment, only the package portions 1 and 2 need to be positioned relative to one another. On account of the firm connection between the plug-in element 6 and one of the two package portions 1 or 2, the plug-in element 6 together with the relevant package portion 1 or 2 is positioned automatically and then needs only to be slid into the first recess 4 and the second recess 5 as explained previously herein.

Figure 8B:
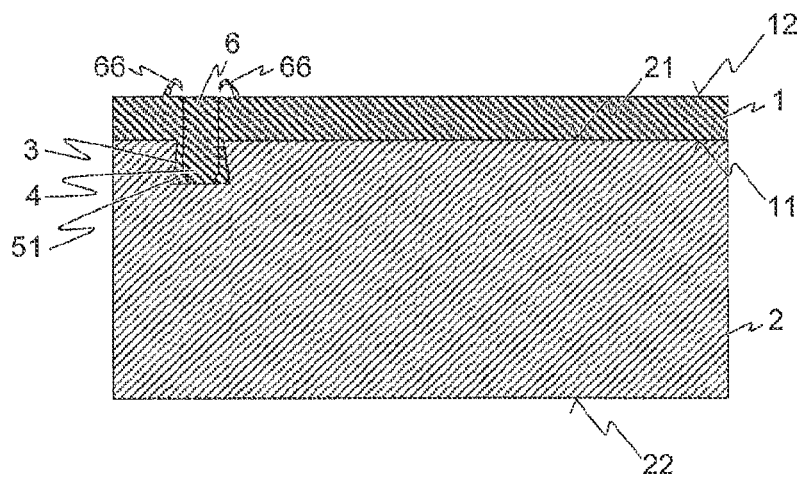
FIG. 8B shows the arrangement shown in FIG. 8A after the snap-off elements have been snapped off as a result of the plug-in element being plugged into a recess in a package side wall.

Optionally, the plug-in element 6 can be separated from the package portion 1, 2 to which it is attached during the sliding-in or by the sliding-in. In the case of the aforementioned connection by means of one or more snap-off elements 66, said snap-off elements respectively form a predetermined breaking point which is snapped off when the plug-in element 6 is slid in, so that the plug-in element 6 is no longer integrally connected to the relevant package portion 1 when it has been slid into the first recess 4 and into the second recess 5 completely. FIG. 8B shows the arrangement after the plug-in element 6 has been slid into the recesses 4 and 5 completely.

The first package portion 1 and/or the second package portion 2 may be produced not only from plastic, as described, but also from metal, for example. In order to provide a metal first package portion 1 with an anchoring element 3, the first package portion 1 and the anchoring element 3 may be of an integral design. Such refinements can be achieved by casting, embossing or milling, for example. However, it is likewise possible for the first packaging portion 1 and the anchoring element 3 to be produced independently of one another at first and then to be connected to one another by soldering, welding, adhesive bonding, clamping, screwing or another connection technique.

Figure 9A:
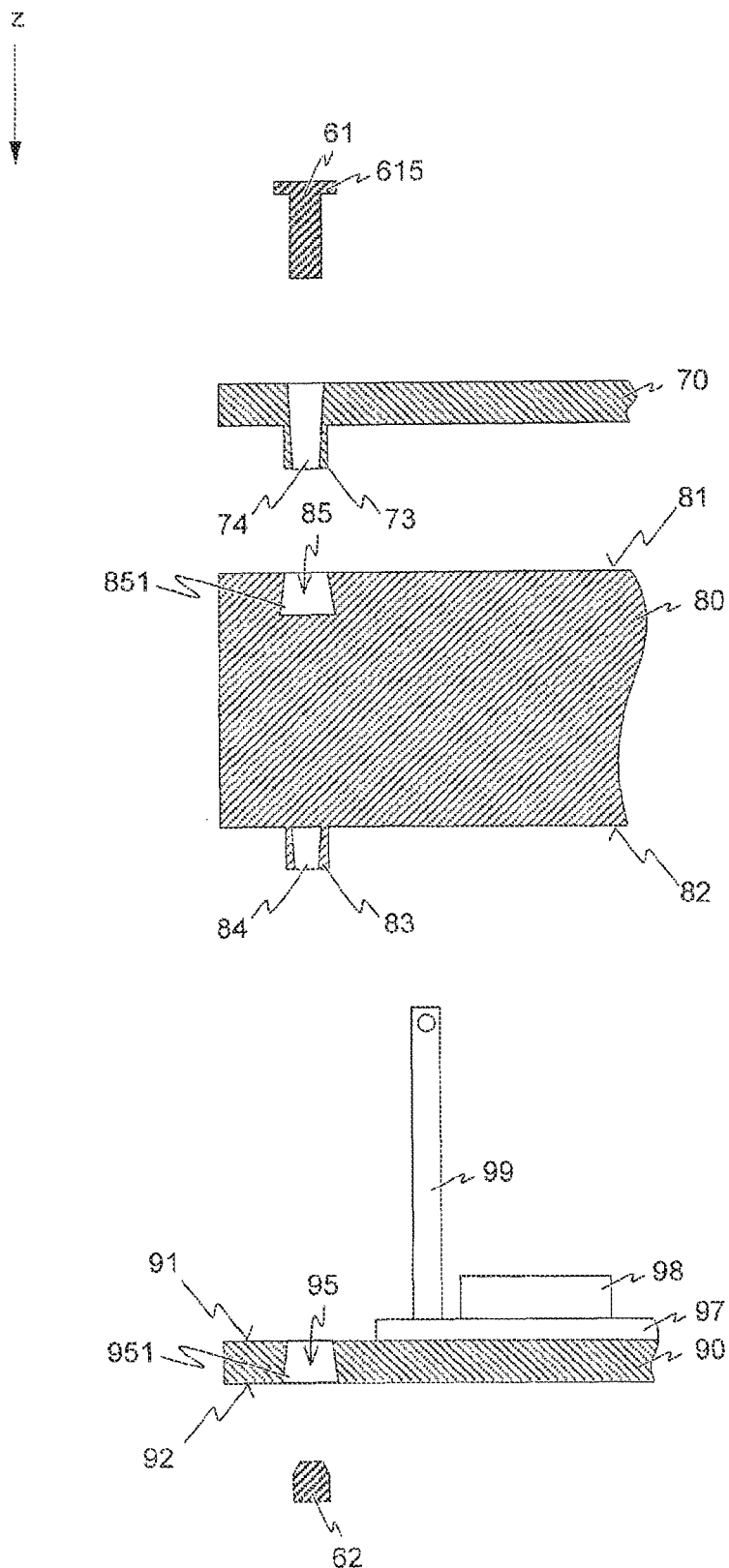
FIG. 9A shows a vertical section through a section of a power semiconductor module during the fabrication thereof, in which a package frame is connected to a package cover and to a baseplate fitted with components.

FIG. 9A shows individual parts of a power semiconductor module during the fabrication thereof. The module includes a package portion 80, e.g. made of plastic, which is in the form of a closed frame, a package cover 70, e.g. also made of plastic, and a metal baseplate 90 of the module package. In addition, a ceramic substrate 97 is provided, the underside of which is provided with a lower metallization which is soldered to the baseplate 90. The top of the ceramic substrate 97 is provided with an upper metallization which is patterned to form interconnects and to which a power semiconductor chip 98 arranged on the ceramic substrate 97, for example a metal-oxide-semiconductor field-effect transistor (MOSFET), an insulated gate bipolar transistor (IGBT), a junction field effect transistor (J-FET), a thyristor, a diode or the like, is electrically conductively connected. The upper metallization and the lower metallization are electrically insulated from one another by the ceramic substrate 97.

In addition, a metal connection strap 99 is provided which is electrically conductively connected to the power semiconductor chip 98 and which is used for making electrical contact with the power semiconductor module on the outside of the module. To this end, the connection strap 99 has a threaded eye. Instead of using a threaded eye, the connection strap 99 can also be provided with a press-fit contact or another connecting element, for example.

The package cover 70 is provided with an anchoring element 73 which has a recess 74. A first side 81 of the package frame 80 has a recess 85 with an indentation 851. A second side 82 of the package frame 80, which is remote from the first side 81, is provided with an anchoring element 83 which has a recess 84. In addition, the baseplate 90 contains a recess 95 which has an indentation. Furthermore, a plug-in element 61 having a stop 615 and a plug-in element 62 are provided.

The package cover 70 and the baseplate 90 can be connected to the package frame 80 using the previously described connection technique.

The package cover 70 is connected to the package frame 80 using the method explained with reference to FIGS. 1A to 1C. In this context, the following equivalents in Table 1 apply:

TABLE 1

| The element shown in FIG. 9A | corresponds to the element in FIGS. 1A to 1C |
|---|---|
| Plug-in element 61 | Plug-in element 6 |
| Stop 615 | Stop 65 |
| Package cover 70 | First package portion 1 |
| Anchoring element 73 | Anchoring element 3 |
| Recess 74 | Recess 4 |
| Package frame 80 | Second package portion 2 |
| Recess 85 | Recess 5 |
| Indentation 851 | Indentation 51 |
| Side 81 | Side 21 |
| Side 82 | Side 22 |

The baseplate 90 is connected to the package frame 80 using the method explained with reference to FIGS. 2A to 2C. In this context, the following equivalents in Table 2 apply:

TABLE 2

| The element shown in FIG. 9A | corresponds to the element in FIGS. 2A to 2C |
|---|---|
| Plug-in element 62 | Plug-in element 6 |
| Stop 625 | Stop 65 |
| Package frame 80 | First package portion 1 |
| Anchoring element 83 | Anchoring element 3 |
| Recess 84 | Recess 4 |
| Baseplate 90 | Second package portion 2 |
| Recess 95 | Recess 5 |
| Indentation 951 | Indentation 51 |
| Side 81 | Side 91 |
| Side 82 | Side 92 |

For the purpose of assembling the power semiconductor module 100, the package frame 80 is placed onto the baseplate 90, fitted with components, such that the anchoring element 83 is arranged in the recess 95. Accordingly, the package cover 70 is placed onto the package frame 80 such that the anchoring element 73 is arranged in the recess 85. In addition, the package cover 70 has an opening through which the upper end of the connection strap 99 with the threaded eye can extend into the outside space of the package for the purpose of making electrical contact later.

Figure 9B:
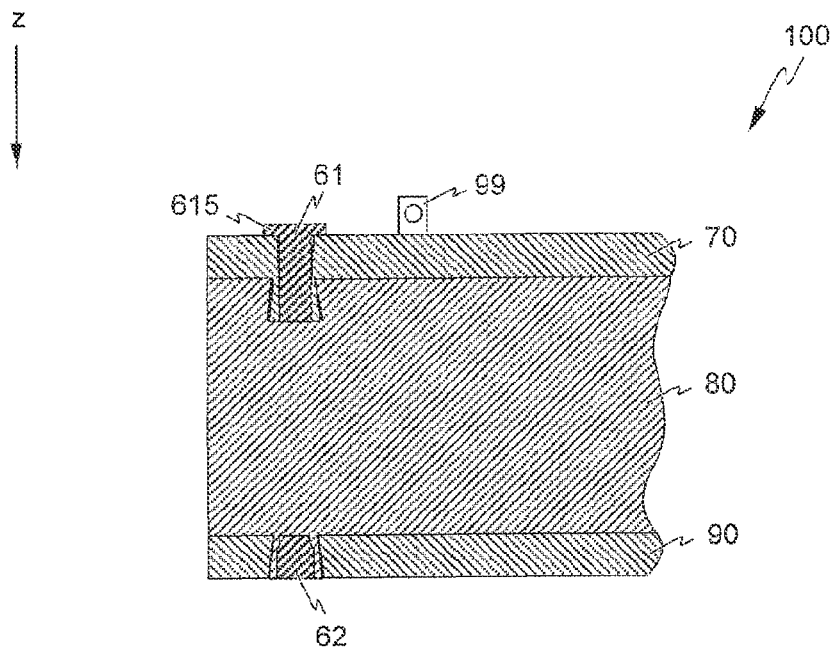
FIG. 9B shows a vertical section through the section of a power semiconductor module which is shown in FIG. 9A after the package cover and the baseplate fitted with components have been assembled on the package frame.

As FIG. 9B shows, the plug-in element 62 is slid into the recesses 95 and 84, after the package frame 80 has been placed onto the baseplate 90 so that the anchoring element 83 engages in the indentation 951. Accordingly, the plug-in element 61 is slid into the recesses 85 and 74 after the package cover 70 has been placed onto the package frame 80 so that the anchoring element 73 engages in the indentation 851. In this way, the package cover 70, the package frame 80 and the baseplate 90 are firmly connected to one another to form a module package for the power semiconductor module 100.

Figure 9C:
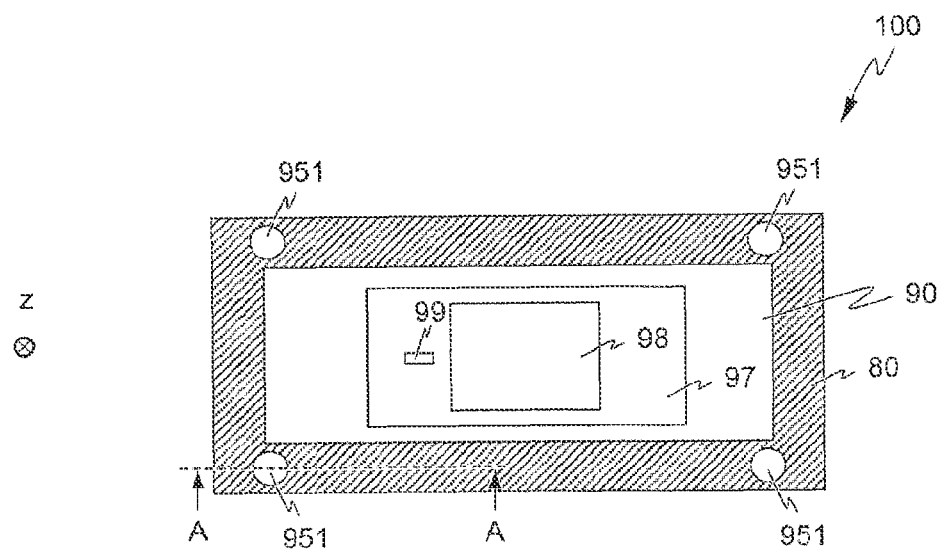
FIG. 9C shows a plan view of the power semiconductor module shown in FIG. 9B with the package cover removed.

FIG. 9C shows a plan view of the power semiconductor module 100 with the package cover 70 removed. FIG. 9C also shows a sectional plane A-A corresponding to the views shown in FIGS. 9A and 9B.

In the plan view shown in FIG. 9C, it is possible to see that the package frame 80 may be in the form of a circumferential, annularly closed frame. In addition, it can be seen from the example of a plurality of recesses 951 in the package frame 80 that it is also possible to use a plurality of the previously explained connection techniques in order to connect two arbitrary package portions. In this case, it is likewise possible to provide any combination of a plurality of identical or equivalent connection techniques which have been explained for the purpose of connecting the two package portions, such as a plurality of the different connection techniques explained.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:
a package having a first package portion and a second package portion, wherein a first side of the first package portion facing the second package portion has an anchoring element with a first recess, the second package portion has a second recess with an indentation which receives the anchoring element and the anchoring element engages the indentation to produce a form-fit connection between the first package portion and the second package portion; and
a plug-in element inserted into the first recess and the second recess and which protects the form-fit connection by remaining in the first and second recesses and thereby preventing the anchoring element from disengaging from the indentation.

2. The power semiconductor module as claimed in claim 1, wherein a section of the anchoring element is arranged in the region of the indentation between the plug-in element and the second package portion.

3. The power semiconductor module as claimed in claim 1, wherein the plug-in element has a stop which hits the first package portion on a second side of the first package portion remote from the second package portion when the plug-in element is inserted into the first recess.

4. The power semiconductor module as claimed in claim 3, wherein the stop is in the form of a circumferential collar on the plug-in element.

5. The power semiconductor module as claimed in claim 1, wherein the anchoring element is slit at least once in the region of the indentation.

6. The power semiconductor module as claimed in claim 1, wherein the first package portion and the anchoring element are integrally formed.

7. The power semiconductor module as claimed in claim 1, wherein the first side of the first package portion is a package side portion and the second package portion is a plastic coverplate or a metal baseplate.

8. The power semiconductor module as claimed in claim 1, wherein the second package portion is a package side portion and the first package portion is a plastic coverplate or a metal baseplate.

9. The power semiconductor module as claimed in claim 1, wherein the plug-in element is bonded or welded to at least one of the first package portion, the second package portion and the anchoring element.

10. A method for fabricating a power semiconductor module, comprising:
providing a package having a first package portion and a second package portion, wherein a first side of the first package portion facing the second package portion has an anchoring element with a first recess and the second package portion has a second recess with an indentation shaped to receive the anchoring element;
positioning the anchoring element in the second recess; and
inserting a plug-in element into the first recess and the second recess to displace the anchoring element laterally in relation to a plug-in direction so that a displaced section of the anchoring element engages the indentation to produce a form-fit connection between the first package portion and the second package portion;
wherein the plug-in element remains in the first and second recesses to protect the form-fit connection by preventing the anchoring element from disengaging from the indentation.

11. The method as claimed in claim 10, wherein the plug-in element has an excess length in relation to the first indentation for providing the lateral displacement.

12. The method as claimed in claim 10, wherein one of the package portions is firmly connected to the plug-in element and arranged between the plug-in element and the other package portion when the anchoring element is positioned in the second recess, and the plug-in element is separated from the package portion to which the plug-in element is connected during insertion of the plug-in element in the first recess and the second recess.

13. The method as claimed in claim 12, wherein one or more snap-off elements connect the plug-in element to the package portion, the plug-in element, the one or more snap-off elements and the package portion to which the plug-in element is connected are integrally formed before separation of the plug-in element, and the plug-in element is separated from the package portion to which the plug-in element is connected by snapping off the one or more snap-off elements.

* * * * *